United States Patent
Nguyen

(10) Patent No.: US 6,460,550 B2
(45) Date of Patent: Oct. 8, 2002

(54) APPARATUS FOR AUTOMATICALLY PERFORMING CLEANING PROCESSES IN A SEMICONDUCTOR WAFER PROCESSING SYSTEM

(75) Inventor: Thu Van Nguyen, San Jose, CA (US)

(73) Assignee: Applied Materials Inc., Santa Clara, CA (US)

( * ) Notice: Subject to any disclaimer, the term of this patent is extended or adjusted under 35 U.S.C. 154(b) by 0 days.

(21) Appl. No.: 09/734,152

(22) Filed: Dec. 11, 2000

(65) Prior Publication Data

US 2001/0012971 A1 Aug. 9, 2001

Related U.S. Application Data

(62) Division of application No. 09/036,333, filed on Mar. 6, 1998, now Pat. No. 6,168,672.

(51) Int. Cl.[7] .............................................. B08B 3/04
(52) U.S. Cl. ................ 134/104.1; 134/57 R; 134/58 R; 134/113; 134/902; 134/200
(58) Field of Search .......................... 134/104.1, 104.2, 134/116 R, 57 R, 58 R, 902, 200, 113

(56) References Cited

U.S. PATENT DOCUMENTS

| | | | |
|---|---|---|---|
| 4,820,377 A | 4/1989 | Davis et al. ................ 156/643 |
| 4,951,601 A | 8/1990 | Maydan et al. ............. 118/719 |
| 5,141,009 A | * 8/1992 | Morantz |
| 5,269,881 A | 12/1993 | Sekiya et al. ............... 156/643 |
| 5,292,393 A | 3/1994 | Maydan et al. ............. 156/345 |
| 5,558,841 A | * 9/1996 | Nakagawa et al. |
| 5,681,424 A | 10/1997 | Saito et al. ................. 156/643 |
| 5,770,100 A | 6/1998 | Fukuyama et al. ........... 216/69 |
| 5,788,799 A | 8/1998 | Steger et al. ............... 156/345 |
| 5,812,403 A | 9/1998 | Fong et al. ............ 364/468.28 |
| 5,820,689 A | * 10/1998 | Tseng et al. |
| 5,824,375 A | 10/1998 | Gupta ........................ 427/569 |
| 5,843,239 A | 12/1998 | Shrotriya .................... 134/1.1 |
| 5,849,092 A | 12/1998 | Xi et al. ..................... 134/1.1 |
| 5,879,574 A | 3/1999 | Sivaramakrishnan et al. . 216/60 |
| 5,910,011 A | 6/1999 | Cruse .......................... 438/16 |
| 5,926,743 A | 7/1999 | Xi et al. .................... 438/905 |
| 5,928,389 A | 7/1999 | Jevtic ....................... 29/25.01 |
| 5,966,635 A | * 10/1999 | Hiatt et al. |
| 5,976,261 A | 11/1999 | Moslehi et al. ............. 118/719 |
| 5,993,916 A | 11/1999 | Zhao et al. ................. 427/535 |
| 6,209,483 B1 | * 4/2001 | Dyer |
| 6,293,291 B1 | * 9/2001 | Sperlich et al. |

* cited by examiner

*Primary Examiner*—Frankie L. Stinson
(74) *Attorney, Agent, or Firm*—Roberts, Abokhair, Mardula; Joseph Bach

(57) ABSTRACT

A semiconductor wafer processing system with a multi-tasking sequencer control that performs an automatic cleaning process for the process chamber or chambers of the system.

20 Claims, 14 Drawing Sheets

APPARATUS FOR AUTOMATICALLY PERFORMING CLEANING PROCESSES IN A SEMICONDUCTOR WAFER PROCESSING SYSTEM

This application is a divisional of application Ser. No. 09/036,333, filed Mar. 6, 1998, now U.S. Pat. No. 6,168,672, which is incorporated herein by reference, in its entirety, for all purposes.

BACKGROUND OF THE DISCLOSURE

1. Field of the Invention

The present invention relates to an integrated circuit wafer processing system and more, particularly, to a multiple chamber wafer processing system that utilizes an automatic cleaning feature which alleviates delays in the process sequence.

2. Description of the Background Art

A multiple chamber integrated circuit processing system which is capable of performing multiple processes sequentially and simultaneously on workpieces, such as integrated circuit wafers, is shown in U.S. Pat. No. 4,951,600 issued to Maydan, et al. (Maydan I) and U.S. Pat. No. 5,292,393 also issued to Maydan, et al. (Maydan II), the disclosures of which are incorporated herein by reference.

The multiple chamber processing system described in Maydan I and Maydan II are basically an integrated vacuum processing system that includes one or more load lock chambers, a transfer chamber and a plurality of vacuum processing chambers communicating with the load lock and transfer chambers through selectively closeable slit valves in each chamber. Each of the processing chambers can be adapted to perform one or more integrated circuit processes such as chemical vapor deposition, physical vapor deposition and rapid thermal processing of one or more wafers positioned within the chamber.

The chemical process regulation and control of the elements of the multiple chamber processing system is provided by a real time multi-tasking control program which permits interactive user input and supervision. In general, a sequencer task module reads a wafer order list which contains the identification and processing recipe, or sequence, for each wafer and schedules the transfer of the wafers among the processing chambers and the process chemistries which occur therein.

The processing chambers after a certain period of time become contaminated from the processing chemicals and must be cleaned. This period is relatively variable because it is dependent upon a number of parameters which generally describe the number and type of process the chamber has used. Process chambers which utilize some chemistries, particularly corrosive ones, ones that have a probability of contaminating subsequent chemistries, or those process chemistries which are inclusive to all wafers, generally require cleaning more often. A particular sequence of chemistries may cause the process chambers to become contaminated quicker and cleaning must take place at what may seem to be random intervals.

In the past, the time needed for cleaning of a chamber was measured outside the real time process sequence by a user and when an alarm was triggered indicating that a certain time has passed or at periodic intervals, the entire system was shut down and the cleaning process was performed. This meant the operator needed to understand what process chemistries had occurred prior to that time, how many and in what order. The operator would then select from a matching cleaning list to perform a number of cleaning recipes on that chamber before restarting the automatic process sequence.

This prior cleaning procedure is quite slow and causes the throughput of the multi-chamber processing system to suffer substantially. The system does no processing while the cleaning process is being effected and the system needs to be pumped down to vacuum after the cleaning process has been completed. Further, with additional process chambers and more complicated sequential processes, it is very difficult for the operator to initiate the correct cleaning recipes at the proper time and still maintain an optimum throughput. This causes additional delays while the operator is determining the recipe to use from the historic data of the processes used and the prior cleaning interval. Additionally, there is still some probability of an operator making an error in choosing a cleaning process which could affect subsequent wafer processing and the quality of the product.

Therefore, a need exists in the art for a automatic cleaning sequence which can be fully integrated with the process chemistry recipes and the automatic manufacturing sequence. One particularly advantageous candidate for an automatic cleaning process is termed a "dry cleaning" process which uses cleaning agents in a gaseous state and heat to clean the process chambers instead of wet chemicals. Such dry cleaning steps are able to be regulated under computer control and can be accomplished while a process chamber is off-line and the rest of the manufacturing sequencing is being completed normally.

SUMMARY OF THE INVENTION

The invention provides a multiple chamber processing system with a multi-tasking sequencer control which performs an automatic dry cleaning process for the process chambers of the system. The cleaning process is accomplished in combination with the manufacturing process which allows the system to continue to process workpieces of the integrated circuit wafer type while a particular one of the process chambers is being cleaned.

The dry cleaning process is automatically scheduled to be seamless with the processing schedules of workpieces in the system. The dry cleaning of a process chamber can then take place at the same time another process is occurring in an adjacent process chamber. The integration of the automatic cleaning process as a system process eliminates the substantial down time which was formerly used for stopping all of the processes when a process chamber was due for cleaning. Workpieces are automatically scheduled around the busy process chamber as they would be when another wafer was being processed. This allows the manufacturing process to be truly continuous and increases throughput significantly.

The dry cleaning processes are performed according to recipes. These recipes correspond to the process chemistries used in a process chamber that is to be cleaned. The cleaning recipe for a particular chamber is thereby formulated on the basis of actual use of the chamber so that it: (1) may be cleaned efficiently when it needs to be and no other process steps for other wafers are contaminated from the residual chemistries in the chamber and (2) process chambers are not cleaned unnecessarily when there is no need to clean a process chamber which saves system resources and increases overall utilization of the system.

The cleaning process is individualized for each process chamber and may be called on a time of usage basis, in the preferred implementation, the number of wafers processed in the process chamber or the accumulated RF on time for the heating elements of the process chamber. Alternatively, the individualized cleaning process may be called because of a change in the type of wafer processed by noting the end of a particular lot processed through the chamber.

In the illustrated implementation of the invention, these methods are executed by a process control sequencer which controls a multiple chamber processing system including one or more load lock chambers, a buffer chamber, an orientor chamber, and a plurality of vacuum processing chambers. Each of the process chambers is adapted to perform one or more integrated circuit processes on the workpieces. A wafer transfer mechanism located centrally in a transfer chamber is used to move wafers among the specialized chambers and process chambers during the process sequence.

The process control sequencer is part of a multi-tasking control program which includes several real time modules including modules for the control of processes within the process chambers and for the transfer of wafers to and from the process chambers. The process sequencer acts on a wafer order list that identifies the wafers of a particular lot of wafers and the operations which they are to be subjected, i.e., their process recipes. The wafers are transferred from chamber to chamber by matching the chemistry steps in the process recipe with the capabilities of the process chambers by commands from the process control sequences to a chamber task module which actually controls the wafer transfer mechanism. The wafer transfers are ordered according to a wafer move list which identifies the workpieces needed to be moved and the sequence for their transfer.

The wafer order list indicates the process recipe to be used for the particular wafer. Preferably, each process recipe program contains a header section which indicates a corresponding cleaning sequence and the criteria for calling the cleaning sequence based on actual usage. The cleaning sequence is comprised of a number of cleaning recipe programs or routines assembled on the basis of the chemistries of an associated process recipe program. Off line editors for formulating the process recipe programs and the cleaning recipe programs in tandem are provided by the process control.

Alternatively, a stored cleaning sequence may be called by an operator if there is not a preprogrammed sequence in a process recipe. This feature allows the automatic cleaning of a process chamber to be scheduled by the process control for specialized processes for which cleaning processes have not been programmed.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

Figure 1:
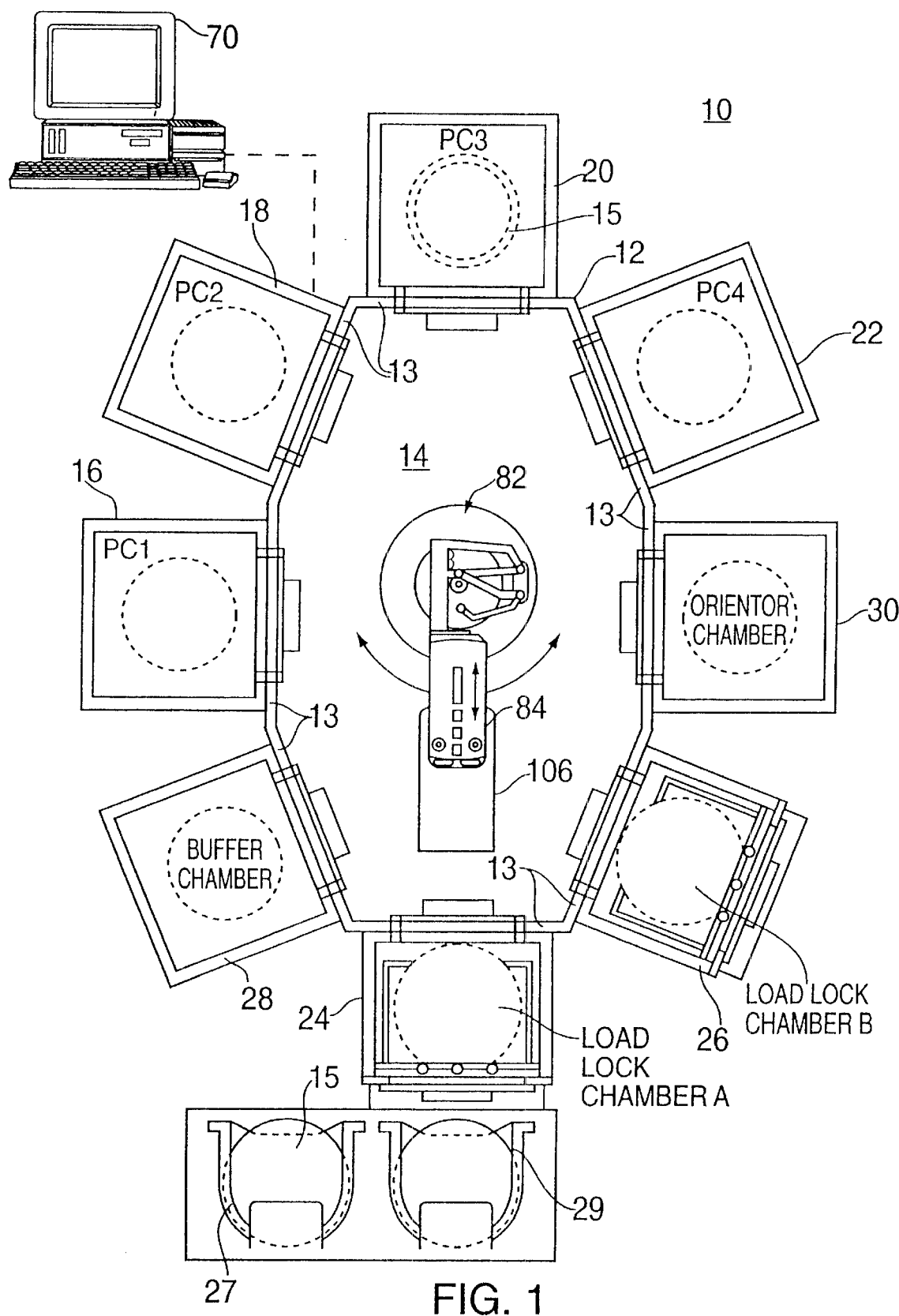
FIG. 1 is a schematic, top plan view of a multiple chamber processing system constructed in accordance with the invention.

FIG. 1 is a top plan view of a preferred embodiment of a multiple chamber semiconductor wafer processing system 10 (a cluster tool) that operates in accordance with the present invention. The cluster tool is particularly adapted to vacuum process workpieces, such as silicon wafers, for integrated circuits of the very large scale integration (VLSI) type. The cluster tool 10 comprises an enclosed, generally octagonal main frame or housing 12 having eight sidewalls 13 that define an enclosed vacuum transfer enclosure or chamber 14.

The cluster tool 10 contains, for example, four process chambers (PC1–PC4) 16, 18, 20, 22, a transfer chamber 14, a buffer chamber 28, a wafer-orientor/degas chamber 30, and a pair of load lock chambers 24 and 26. Each process chamber represents a different stage or phase of semiconductor wafer processing. To effectuate wafer transfer amongst these chambers, the transfer chamber 14 contains a first robotic transfer mechanism 82, e.g., a single blade robot (SBR). The wafers 15 are typically carried from storage to the system in a plastic transport cassette 27, 29 that is placed within one of the load lock chambers 24 or 26. The robotic transport mechanism 82 transports the wafers 15, one at a time, from the cassette 27, 29 to the wafer orientor/degas chamber 30. The buffer chamber 28 is generally not used until after the wafer is processed within the process chambers 16, 18, 20, 22. Individual wafers are carried upon a wafer transport blade 106 that is located at the distal end 84 of the first robotic mechanism 82. The transport operation is controlled by the controller 70.

The controller 70 controls the processing and wafer transfer performed by the cluster tool 10. The controller contains a microprocessor (CPU), a memory for storing the control routines, and support circuits such as power supplies, clock circuits, cache and the like. The controller 70 also contains input/output peripherals such as a keyboard, mouse, and display. The controller 70 is a general purpose computer that is programmed to perform the sequencing and scheduling operations that facilitate wafer processing and transport. The software routines that control the cluster tool are stored in memory and executed by the microprocessor to facilitate control of the cluster tool.

It is contemplated that some of the process steps discussed herein as software processes may be implemented within hardware, e.g., as circuitry that cooperates with the microprocessor to perform various process steps. Although the controller is depicted as a general purpose computer that is programmed to perform various scheduling routines, the processes that are implemented by the software can be implemented as hardware as an application specific integrated circuit (ASIC) or discrete circuit components. As such, the process steps described herein are intended to be broadly interpreted as being equivalently performed by software, hardware, or any combination thereof.

The transfer chamber 14 is surrounded by, has access to, the four process chambers 16, 18, 20 and 22.

Once processing is complete within the process chambers, the transport mechanism 82 moves the wafer from the process chamber and transports the wafer to the buffer chamber 28. The wafer is then removed from the buffer chamber and placed in transport cassette 27, 29 within the load lock chamber 24 or 26.

Figure 2:
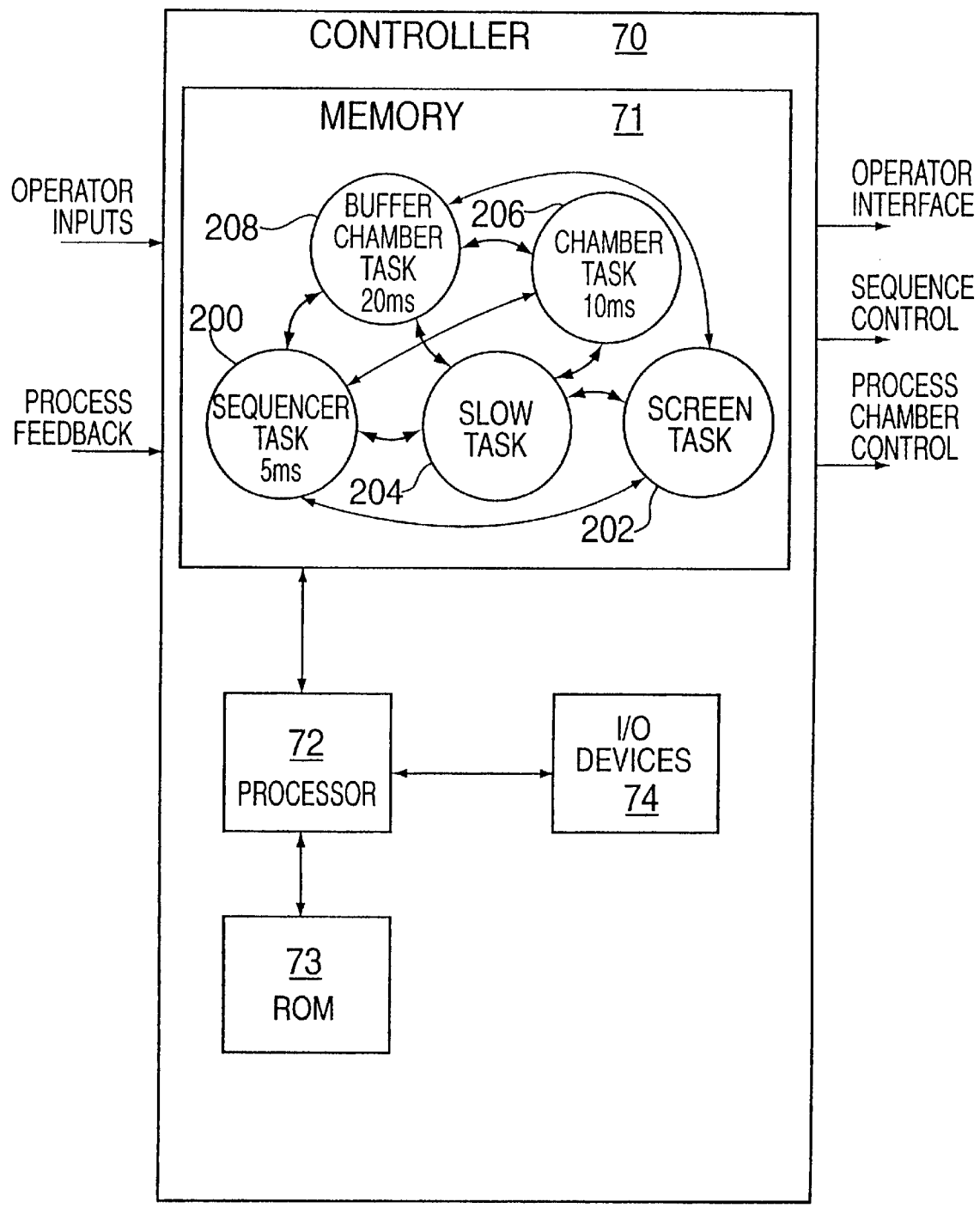
FIG. 2 is a pictorial system flow diagram of the process control program of the controller illustrated in FIG. 1.

The controller 70 executes system process control software to produce the automatic control and process sequencing as more fully described with reference to FIG. 2. More specifically, the controller 70 can be implemented as a general purpose computer (e.g., a mainframe computer, a workstation, a personal computer or a micro-controller) for controlling a multiple chamber processing system. The general purpose computer may comprise a central processing unit (CPU) or processor 72, a memory 71, a ROM 73 and various input/output devices 74, e.g., a monitor, a keyboard and/or various storage devices.

In the preferred embodiment, the controller is a microcomputer and incorporates a novel system software application as described below. The system software is represented by one or more software applications or modules which are loaded into the memory 71 from an I/O device 74, e.g., a magnetic or an optical disk drive, diskette or tape. Alternatively, the system software can be implemented as firmware, e.g., stored within a read only memory (ROM) 73 and the like. As such, the system software of the present invention can be stored on one or more computer readable media. Finally, once the software applications are loaded, the processor 72 applies the novel system software in the memory to implement a wafer apparatus cleaning process. Generally, the processor 72 may be one of any commercially available microprocessors, e.g., a model 680×0 manufactured by Motorola, Inc.

More specifically, the system software is multi-tasking and divided into real time task oriented modules which are called on an interrupt basis from timers which generate periodic call signals. The basic system software as seen in FIG. 2 includes a sequencer task module 200, a screen task module 202, a slow task module 204, a chamber task module 206, and a buffer chamber task module 208. Although the preferred embodiment of the present invention describes the use of multiple task oriented modules, it should be understood that the functions performed by these modules can be implemented in any number of different modules (e.g., using greater number of modules using less number of modules, or even using a single sequencer task module performing all the necessary functions).

Returning to FIG. 2, each of the previously described modules 200–208, when called, interrupts the processing of the modules that execute slowly, finishes their processing and then returns to the interrupted routine at the last exit point. This conventional multi-tasking hierarchical operation allows more critical operations to be processed on a real time basis without seriously affecting the processing of other tasks in the system. Each of the modules 200–208 can communicate with the any of the other modules by changing a data structure which the other module operates on, by leaving a message or data for the other module on its exit, or by issuing a command to another module during its processing which is thereafter executed during processing by the commanded module.

Generally, the sequencer task module 200 controls the sequencing or stepwise process of the wafer manufacturing including the process recipe programs and the cleaning recipe programs. The module 200 operates on a data structure, the wafer order list (WOL), which describes the wafers loaded in the load locks 24 and 26 and their process and cleaning recipes, i.e., the sequence and chemistries of the processes for different chambers. The process and cleaning recipes are each associated with a particular wafer of the WOL through another data structure, the wafer management data structure (WMDS), by a pointer to the information. The sequencer task module 200 operating on the information in the WOL and WMDS issues commands to the chamber task module to run the process steps of a particular process recipe or cleaning recipe for a particular chamber at the correct time. The wafers are moved through the different chambers by the sequencer task module 200 operating on a data structure, the wafer move queue (WMQ), which describes the transfer operations of the system to match the processing chemistries of the particular chambers. If there are any wafers on the WMQ, then the sequencer module commands the buffer task module 208 to perform the movement by control of the entrance slits of the chambers and the wafer transfer mechanism 80.

The chamber task module 206 handles the various recipes for integrated circuit processes on a wafer and for the cleaning recipes for a chamber including the actual control of the vacuum valves, process ionization of different chemicals, turning the heating elements/lamps on or off, etc. The chamber task module 206 monitors and controls the processes occurring in the process chambers by its operation on a data structure, the chamber data structure (CDS).

The screen task module 202 permits an operator to program certain data into the data structures of other modules as well as leave messages and commands in an interactive manner to the processes before they are started and during their execution. One of the main parts of the screen task module 202 is an interactive text editor, permitting an operator to input and edit data and commands through an operator interface or display and store them to the control and management modules for the processes. The screen task module 202 also allows the operator to display various status, alarm and monitoring information during the execution of the automatic control sequence of the system.

A slow task module 204 is also provided to monitor and time certain tasks for the system which operate at a relatively slow pace. For example, the cleaning time for a chamber may be monitored by determining the amount of time the RF coils have been energized or active in producing a cleaning plasma.

The dry cleaning process is managed by the sequencer task module 200 operating on two specialized data structures which describe the cleaning process to be accomplished, the time at which the cleaning should be accomplished, and the process chamber where cleaning is to be performed. The first data structure, termed the dry clean data structure, is a general data structure for the cleaning process having entry fields for all options of the process. It performs the important function of linking a dry cleaning process to a particular process recipe program and the options selected for that linkage. The cleaning process which is linked by the dry clean data structure is provided by a second data structure, the dry clean sequence program (DSCP). The DSCP is a sequence of cleaning recipe programs (CRPs) (or cleaning recipe steps) arranged such that the cleaning steps correspond to the chemical process steps of the process recipe program. An associated set of these data structures for each process recipe program can then be used to provide an automatic cleaning process while the multiple chamber system remains under vacuum and continues to process wafers in chambers not being cleaned. The cleaning process for a chamber is thus scheduled similar to that of the manufacturing process.

Figure 3:
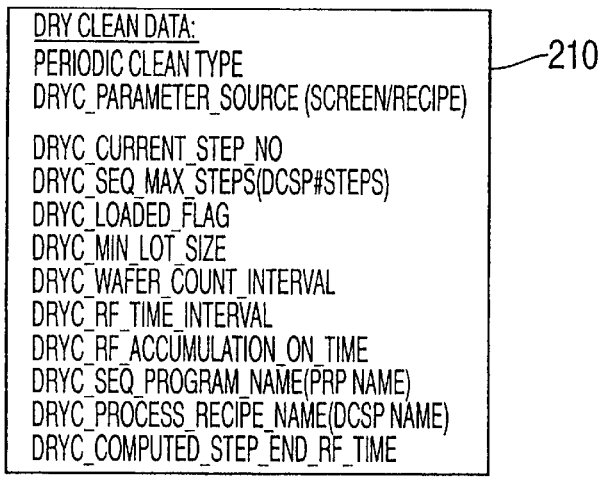
FIG. 3 is a tabular representation of the dry clean data structure used by the process control program illustrated in FIG. 2.

The dry clean data (DCD) structure 210 (a first data structure) will now be more fully explained with reference to FIG. 3 which is a pictorial representation of a preferred embodiment of the structure. The (DCD) structure 210 contains a number of data fields (cleaning parameters) which are loaded with initial parameters to guide a cleaning process and open data fields for storage of intermediate parameters used during the dry cleaning process. The first field of the DCD structure 210 identifies the type of cleaning process which is to be used with an associated process chamber and process recipe and can be either periodic or by lot. If periodic, the cleaning can be based upon the number of wafers processed or the accumulated RF over time of a process chamber. The next field indicates the source of the dry cleaning data (DCD) in the DCD structure 210, either from the system control screen or from a DCSP file.

The next two fields are to allow the sequencer task module 200 during a cleaning process to store the number of the current step in a dry cleaning sequence for a chamber and to compare it to the total number of steps in the cleaning process stored in the next field. The fifth field in this structure is to alert the sequencer task module 200 that the DCD structure 210 is currently being executed by the sequencer task module, because its busy flag is set.

Subsequently, three fields are reserved for the parameters or conditions (chamber operating parameters) to call this particular cleaning process. The first is for the condition where cleaning is to be accomplished based on wafer lot and is the minimum lot size that will trigger the cleaning process. The next two fields are for the triggering conditions where the cleaning process is to occur on a periodic basis, i.e., by wafer count or by RF accumulated on time, and are the intervals between cleanings.

It should be understood that although three chamber operating parameters are described above, other chamber operating parameters can be used to trigger a cleaning process, e.g., the duration (elapsed time) that a chamber has being operating from the last cleaning, the detection of contamination in the chamber, the type of chemistries processed in the chamber and the like. Since chamber cleaning is often dictated by the processes employed in the chambers, chamber operating parameters are generally based on the processes performed by the substrate processing system.

An intermediate storage location is then provided for accumulating the RF on time so that it can be measured for the cleaning process. The next two fields contain the names (pointers to) of the dry cleaning sequence program file and the associated process recipe program file, respectively, thereby linking the two. The last field allows the DCD structure 210 an intermediate storage location to accumulate the RF on time for a step of one of the cleaning recipe programs.

Figure 4:
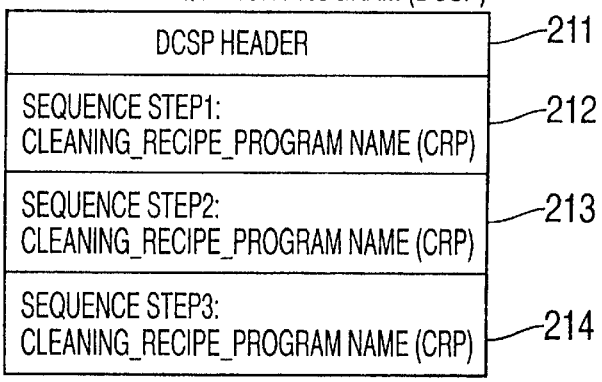
FIG. 4 is a tabular representation of the dry clean sequence program used by the process control program illustrated in FIG. 2.

The dry clean sequence program (DCSP) file structure will now be more fully described with respect to FIG. 4. The DCSP file begins with a header 211 which identifies the program and contains the prefix "DSEQ". The header 211 is followed by a sequence of various cleaning steps 212, 213 and 214 which can be from 1–13 steps. The maximum number of steps is a convention of the illustrated method and is substantially more steps than is usually needed for a cleaning sequence; however more steps can be added if needed. Each of the steps 212, 213 and 214 is a name of (pointer to) a cleaning recipe program which was produced in the recipe editor concurrently with the process recipe program. Thus, the DCSP file is a convenient and efficient method for ordering the cleaning process and can be assembled in a flexible manner to produce a DSCP file which will match the cleaning needs of a process recipe. The sequencer task module 200, once the cleaning process is invoked for a chamber, will begin to execute the cleaning recipe program steps of the DSCP file one after the other in the correct sequence until the end of the file.

Figure 6:
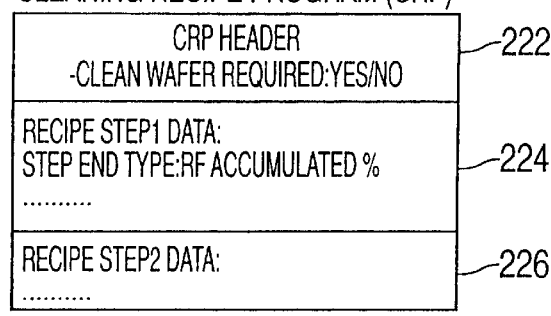
FIG. 6 is a tabular representation of the cleaning recipe program used by the process control program illustrated in FIG. 2.

Each cleaning recipe program or step has a data structure (third data structure) illustrated in FIG. 6. The cleaning recipe structure or file begins with a header 222 which identifies the program, indicates whether a cleaning wafer must be used in the program, and is followed by a number of recipe steps (224, 226) which can be from 1–20, for illustrative purposes. Each recipe step is actually a command to the chamber task module 206 to either turn on or turn off the heating element or RF power, to open or shut the door, or to input or exhaust one or more cleaning gases. The cleaning process step can also be one of two types: RF accumulated % or until done, which indicates to the sequencer task module 200 how to end the step. The "until done" steps are generally for commands that do not have to be timed while the "RF accumulated %" steps are timed to occur at specific times or are durational in nature and require a timer. Specifically, for those cleaning process steps which require a plasma, the RF accumulated % type of step end identifier is used.

Figure 5:
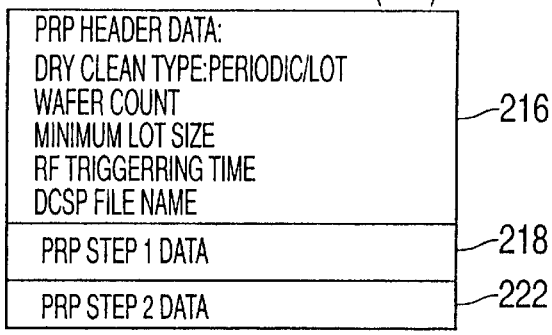
FIG. 5 is a tabular representation of the process recipe program used by the process control program illustrated in FIG. 2.

Each process recipe program has a similar structure to that illustrated in FIG. 5. The process recipe file begins with a header which contains associated DCD and is followed by a number of recipe steps (218, 222) which can be from 1–20, for illustrative purposes. Each recipe step is actually a command to the chamber task module 206 to either turn on or turn off the RF power, to open or close the door, move a wafer from one chamber to another, or to input or exhaust one or more process gases. The header which also invokes the automatic cleaning process for this particular wafer process includes a field which indicates the dry clean type which can be: periodic or by lot and a field which contains the DCSP file indicating the particular cleaning process to be invoked or associated with this process. The rest of the header is made up of process parameters including the minimum lot size, wafer count and RF triggering time.

The dry clean data structure and cleaning process is programmed and controlled by the operator by using several of the interactive programs of the screen task module 202 as will be more fully described with respect to FIGS. 7–12.

Figure 7:
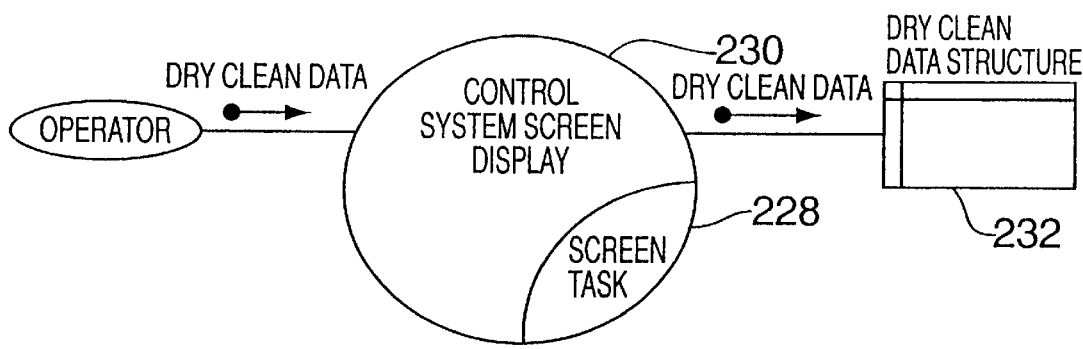
FIG. 7 is a system flow diagram of the operation for forming the dry clean data structure used by the process control program in FIG. 2.
Figure 8A:
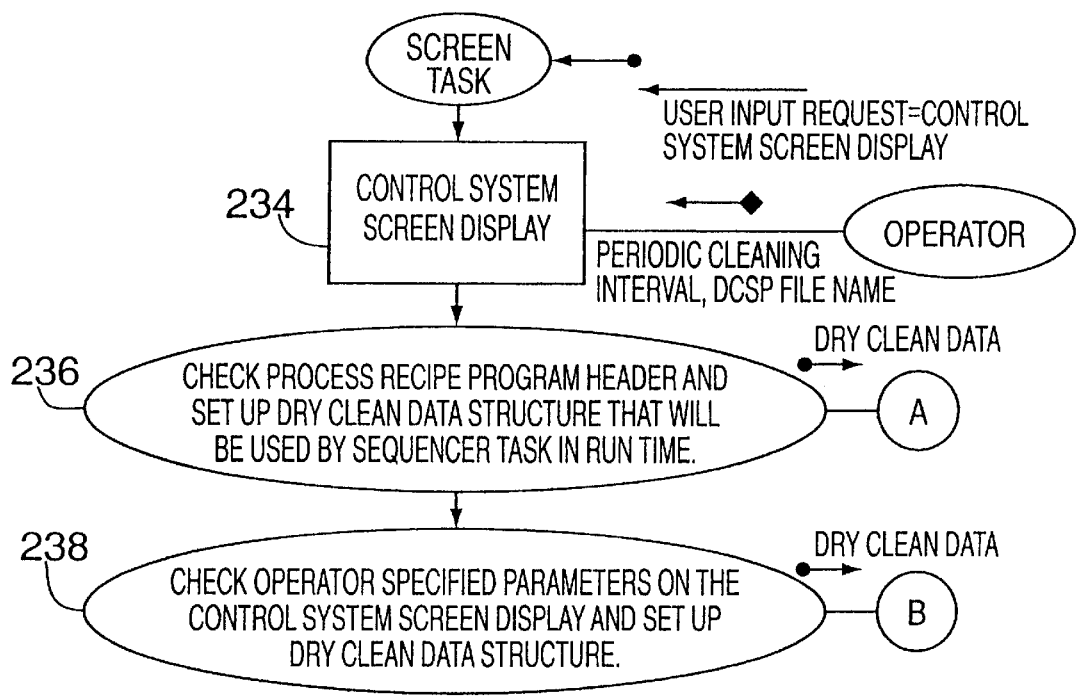
FIGS. 8a–8c are a detailed flow diagram of the process illustrated in FIG. 7.

A control system screen display program 230 in FIG. 7 is called by the operator as a task of the screen task module 228. The control screen display allows the operator to determine the control variables of the process by observing an interactive screen on the monitor of controller 70 (FIG. 1) which indicates the system data and allows the operator to change that data, if necessary, on dry clean data structure 232. With reference now to FIG. 8a, to initiate the automatic process sequencing and dry clean process, the operator must determine the process recipe to be run and the dry clean data structure associated therewith. After calling the control system screen display in block 234, the program will first read in the process recipe program header to determine if the DCD structure is already set up in block 236. If the data is not in the process recipe program header, then the operator may enter the parameters (operator input data) into the interactive screen of the control system screen display and thereafter into a DCD structure in block 238.

Figure 8B:
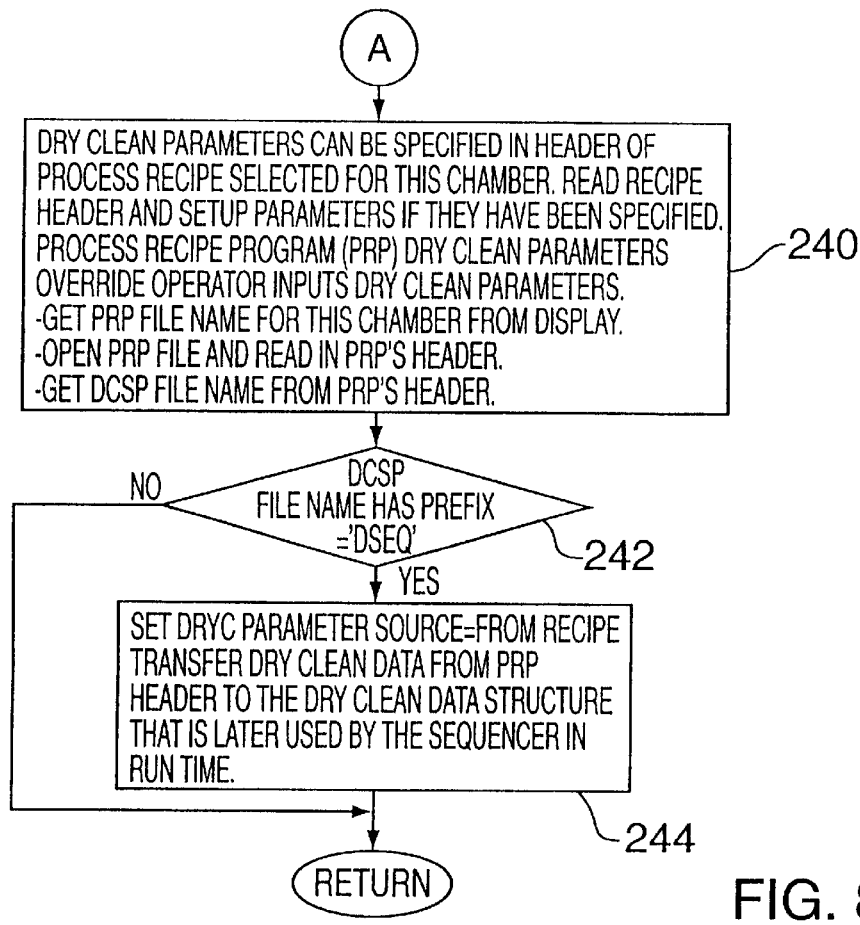

The steps in FIG. 8b implement block 236 of FIG. 8a, where the process recipe program for a process chamber is then opened in block 240 by reading it from the memory and determining whether or not it has the dry clean data necessary for the dry clean data structure in its header. The dry clean sequence program file name is also read from the header of the PRP file for the chamber. The dry clean sequence file name is then tested in block 242 for a prefix of "DSEQ" which is a prefix only given to dry clean sequence program files. If the file name in the header is not a dry clean sequence program, then the program returns to the control system screen display for further processing. If the query at step 242 is affirmatively answered, then the data in the file is for the dry clean sequence and the dry clean data structure can be assembled in block 244. The assembly begins by identifying the dry clean parameter source as the process recipe program in the DCD structure, i.e., "Dryc Parameter Source=From Recipe". The dry clean data in the header of the process recipe file is then transferred to the respective areas of the DCD structure. After assembly of the dry clean data structure, it is stored in the memory for use by the sequencing task module 200 and the chamber task module 204.

Figure 8C:
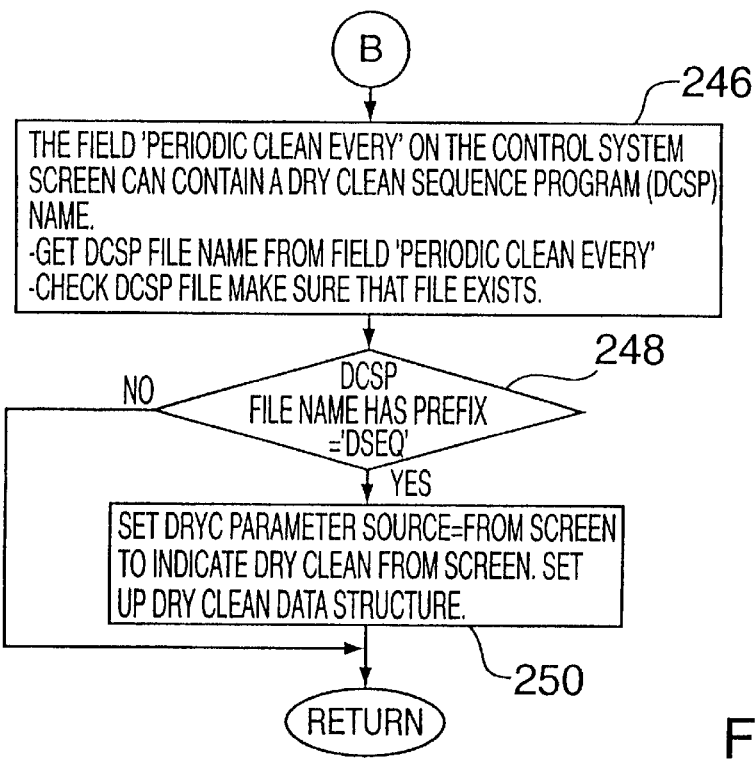

Alternatively, in FIG. 8c which steps implement block 238 in FIG. 8a, the control system screen display contains a field labeled "Periodic Clean Every" which may contain a DCSP file name. If no dry clean data was found in the header of the process recipe program, then this file name is read and checked in block 246 to determine if it is a dry clean sequence program file by testing it for a prefix of "DSEQ" in block 248. If the file name in the field is not a dry clean sequence program, then the program returns to the control system screen display for further processing. If the query of step 248 is affirmatively answered, then the data in the file is for the dry clean sequence and the dry clean data structure can be assembled in block 250. The assembly begins by identifying the source of the dry clean parameters as the screen input, i.e., the "Dryc parameter source=From Screen". The dry clean data in the DCSP file is then transferred to the corresponding areas of the data structure. After assembly of the dry clean data structure, it is stored for use by the sequencing task module 200 and the chamber task module 204 in the memory.

This sequence allows the data for the dry clean data structure that controls the DCSP to come either from the header of the process recipe program, a previous defined DCSP that is operator selected or the operator, but in a preferential manner. The inputs from the process recipe program or the DCSP override the operator's input if they are present and requested. If they are not requested, or not present, then the program allows a manual input of the cleaning parameters to the dry clean data structure as a default mode so that there is some specification for the system to operate on.

Figure 10:
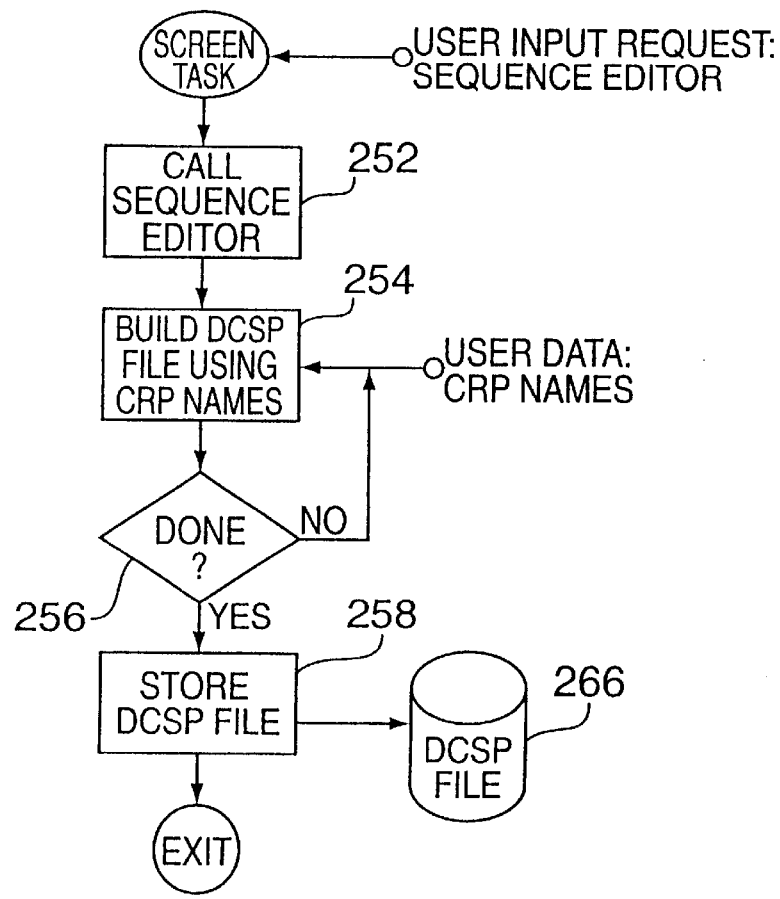
FIG. 10 is a detailed flow diagram of the process illustrated in FIG. 9.
Figure 9:
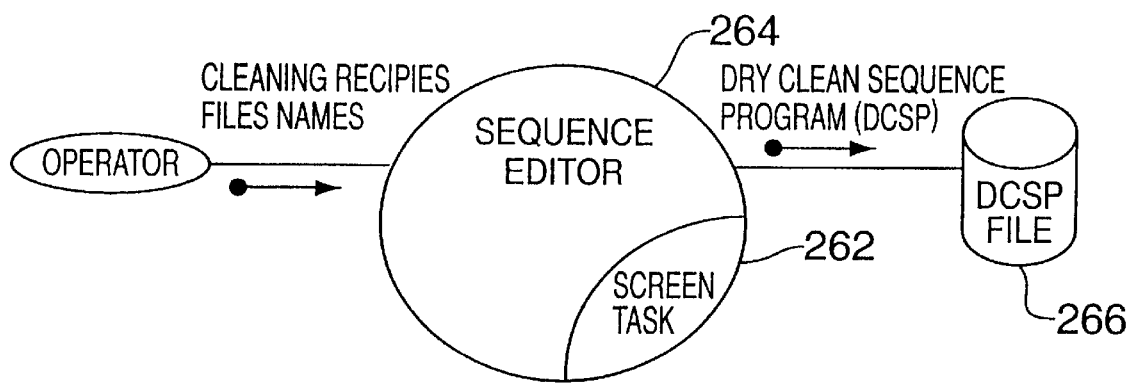
FIG. 9 is a system flow diagram of the operation for forming a dry clean sequence program used by the process control program illustrated in FIG. 2.

An off line sequence editor program 264 is normally called by the operator as screen task 262 in FIG. 9 to build dry clean sequence program (DCSP) files. More specifically, FIG. 10 illustrates a user input mode of the interactive text editor for the screen task module 202, where the user types the request: sequence editor. The program is called in block 252 and asks the operator for the name of a first cleaning recipe program. The user continues to input the names of the cleaning recipe programs (CRPs) in block 254 until a DSCP file has been built with the cleaning recipe programs in the correct sequence matching the process recipe programs associated with the file. This program allows the operator to build sequences of cleaning steps which are as complex or simple as needed for the particular process recipe being used. The cleaning recipes can be placed in any order depending upon the system needs in and the associated process recipe program. Once the DCSP file has been completed, as tested for in block 256, the program stores the DSCP file in block 258, e.g., in memory 266 with a special prefix: "DSEQ" for later identification during recall. After the DSCP file has been assembled, the operator may command the program to exit back to the screen task module 202 in the user input mode.

Figure 11:
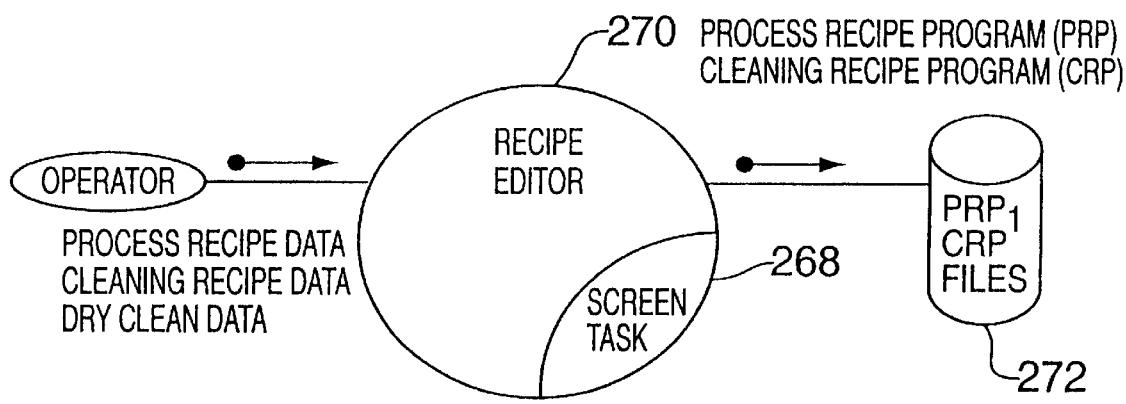
FIG. 11 is a system flow diagram of the operation for forming the process recipe program files and the cleaning recipe program files used by the process control program illustrated in FIG. 2.

In FIG. 11, a recipe editor program 270 may be called as part of the operation of the screen task module 268 to allow the operator to assemble process recipe programs (PRPs) and cleaning recipe programs (CRPs) which are then stored, e.g., in the memory 272 of the controller 70. These CRPs are used with the sequence editor to generate the dry clean sequence program which can be stored in the long term memory, e.g., storage devices of system 10.

Figure 12:
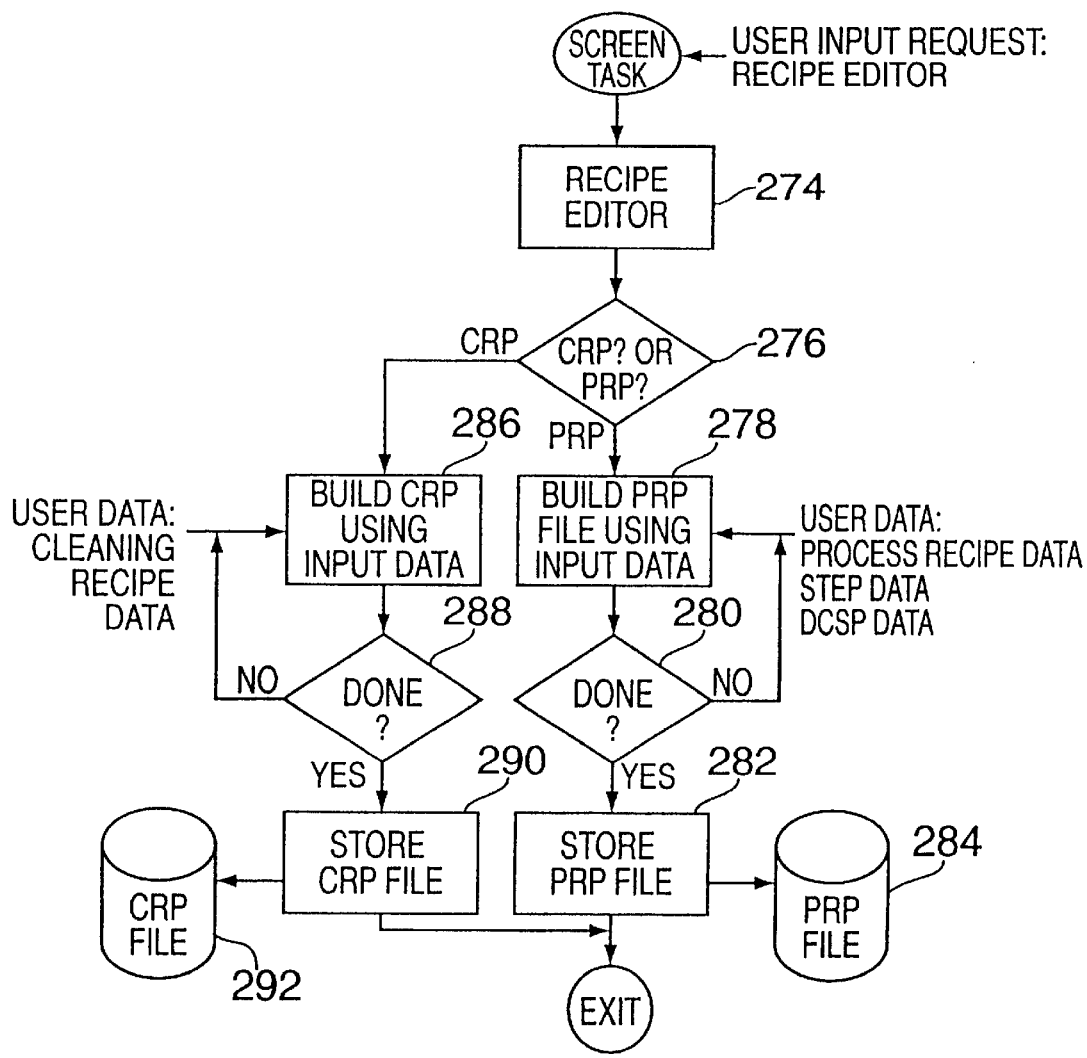
FIG. 12 is a detailed flow diagram of the process illustrated in FIG. 11.

The steps in FIG. 12 implement the block 270 of FIG. 11. In the user input mode of the interactive text editor for the screen task module 202, the user types the request: recipe editor. The recipe editor program is called in block 274 and asks the operator whether the recipe to be input is for a process recipe or for a cleaning recipe in block 276. If the recipe is determined to be a cleaning recipe, the program branches to the cleaning recipe mode in block 286 and requests information on the first step of the cleaning recipe program. The user may continue to input the cleaning recipe data steps until a file has been built with the cleaning recipe in the correct sequence matching the process recipe program associated with the file. This program allows the operator to build processes of cleaning recipe steps which are as complex or simple as needed for the particular process recipe being used. The cleaning recipe steps can be placed in any order depending upon the system needs and the associated process recipe program. Once the cleaning recipe program file has been completed as determined by block 288, the program stores, in block 290, the file in memory 292 as a CRP file for call up by the operator to build the DCSP file and the dry clean data structure. The operator may then exit back to the main screen task module 268 in the user input mode.

If the decision in block 276 was that the recipe to be built is a process recipe, then the program branches to the process recipe mode and requests information on the first step of the process recipe program in block 278. The operator continues to input the process recipe data steps until a file has been built with the process recipe steps in the correct sequence. In addition to the process recipe data, the operator can also enter the name of a dry clean sequence program file in the header. This will cause the program to load the header of the process recipe program file with cleaning data for the dry clean data structure. Along with the DCSP file data, the user may also enter step data which in the case of the cleaning process indicates the amount of RF on time the chamber spends during the cleaning process on a particular step. This program allows the operator to build sequences of process recipe steps which are as complex or simple as needed for the particular process being used. The process recipe steps can be placed in any order depending upon the system needs. Once the process recipe program file has been completed as tested by block 280, the program stores, in block 282, the file in memory 284 for call up by the operator or system during operation by the sequencer task module 200. The program then returns to the screen task module in the user input mode.

Figure 13:
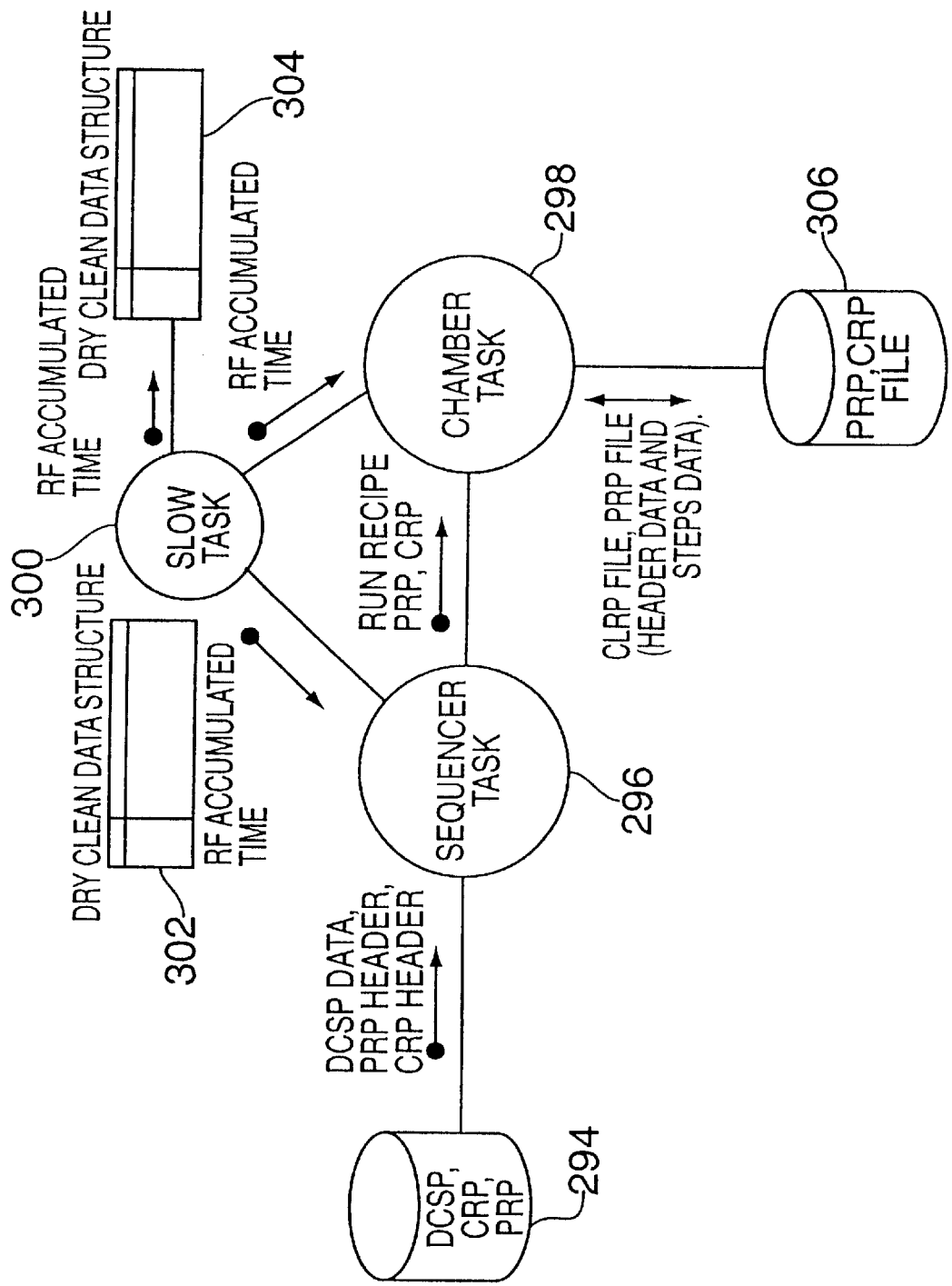
FIG. 13 is partial system flow diagram of the process control program illustrated in FIG. 2 showing the task modules and data structures used in a automatic cleaning process performed in accordance with the invention.

FIG. 13 illustrates operation of the dry cleaning process by the sequencer task module 296. In general, the sequencer task module 296 is called on a real time basis by an interrupt every 50 ms. (It should be understood that various interrupt periods discussed in the present invention can be adjusted to accommodate a particular implementation.) The sequencer main program runs all of the partitions of the sequencer task module 296 in a particular order and then returns to a dormant state after it is finished. Basically, it determines every pass whether a triggering condition of the dry cleaning process has occurred, i.e., whether a particular chamber has processed a set lot of wafers, or the number of wafers processed or the accumulated RF on time for that chamber exceeds the periodic interval. When the cleaning process is triggered, the sequencer task module 296 obtains the cleaning process specified for the chamber from the DCD structure 302 and its sequence from the DCSP file from storage 294 by reading the process recipe header. The sequencer task module then schedules these tasks in a manner similar to the process recipe steps by commanding the chamber task module 298 to perform them at a particular time and in a particular sequence to facilitate chamber cleaning. The slow task module 300 communicates with both the sequencer task module 296 and the chamber task module 298 through commands and the DCD structure 302 to accumulated RF on time for the chamber for triggering the call for cleaning, and to accumulate RF on time during the cleaning process to indicate the end to certain cleaning steps. The slow task 300 periodically updates the accumulated RF on time (as well as other data) in the DCD structure 302 to form DCD structure 304. As such, the DCSP will utilize the most up to date DCD structure when needed.

The main module for the dry cleaning process is entered as one of the real time programs from the sequencer main program list and is disclosed in more detail in FIGS. 14a–14e. Specifically in FIG. 14a, the main module for the dry cleaning process is entered in the sequencer main program 308 after presequencing the process wafers and executing the wafer order list. In steps 310 and 312, scheduling of the dry cleaning process is performed by determining if a chamber is busy. If the first chamber is busy, then the next chamber is checked to determine if it is busy. If the sequencer task module 200 has a process task scheduled for the chamber, it will have a busy flag set in the chamber data structure which will not allow the cleaning routine to be executed. However, once the process recipe step for a particular chamber is complete, and before the routine exits, the routine clears the chambers busy flag in the chamber data structure. That chamber may then be available for cleaning.

Just because a chamber is not running a wafer process, does not mean that the cleaning will begin for that particular chamber. A number of checks or triggers in steps 314, 316 and 318 are used to determine if it is time to clean the chamber. If not, then in block 320 the dry cleaning main program will update the wafer count in the chamber data structure, or determine whether the end lot flag should be set in the dry cleaning data structure. The program will then return until it is called during the next 50 ms sequencer task module interval. Therefore, every non-busy chamber is checked every 50 ms to determine whether the chamber is available for cleaning and if it is at a particular point where a scheduled cleaning should be accomplished. If both of these conditions coincide, the dry cleaning process is executed and the cleaning recipes are invoked.

The first checking routine 314 is to determine if the wafer count for a chamber is greater than a particular number (wafer interval). This allows for a periodic cleaning based on absolute throughput of the chamber. The second checking routine 316 is by accumulated RF on time for a chamber. If the accumulated RF on time exceeds a particular threshold (RF interval), then a periodic cleaning process is run on the chamber. Lastly, the check for the end of a particular lot is determined in block 318 and the dry cleaning process run if that condition is found. This allows a cleaning process to be invoked for a particular type of wafer process where the chamber may then be changed at the end of a wafer lot. Usually, only one criteria is used in the DCD structure to trigger cleaning, but it is evident that more than one can be used in any different combination. This technique provides a very flexible method of scheduling the cleaning of a particular chamber while still allowing that at particular absolute intervals, including the number of wafers processed the by chamber or the accumulated RF on time, that a cleaning process may be used.

Figure 14A:
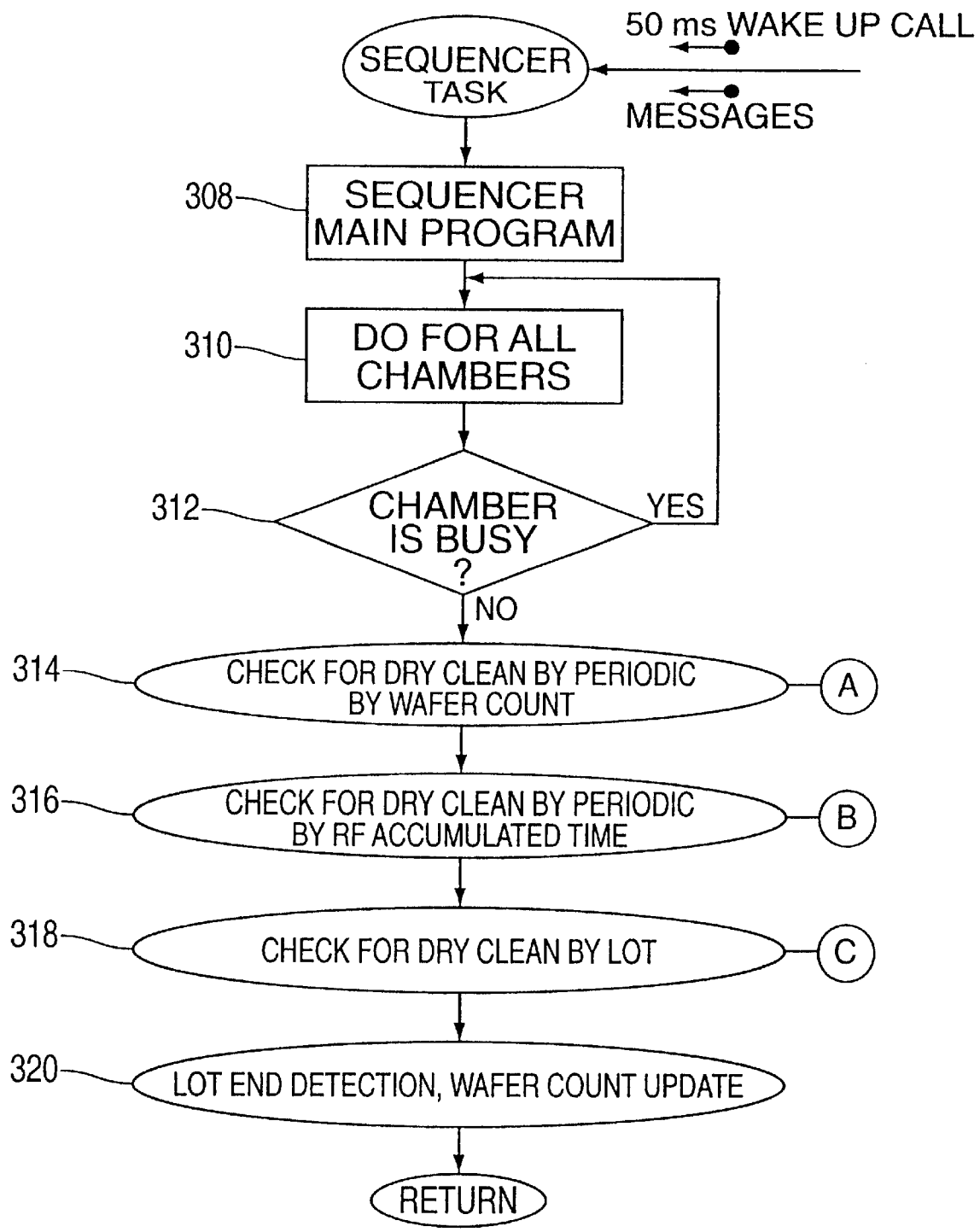
FIGS. 14a–14e are a detailed flow diagram of the automatic cleaning process operations of the sequencer task module illustrated in FIG. 13.
Figure 14B:
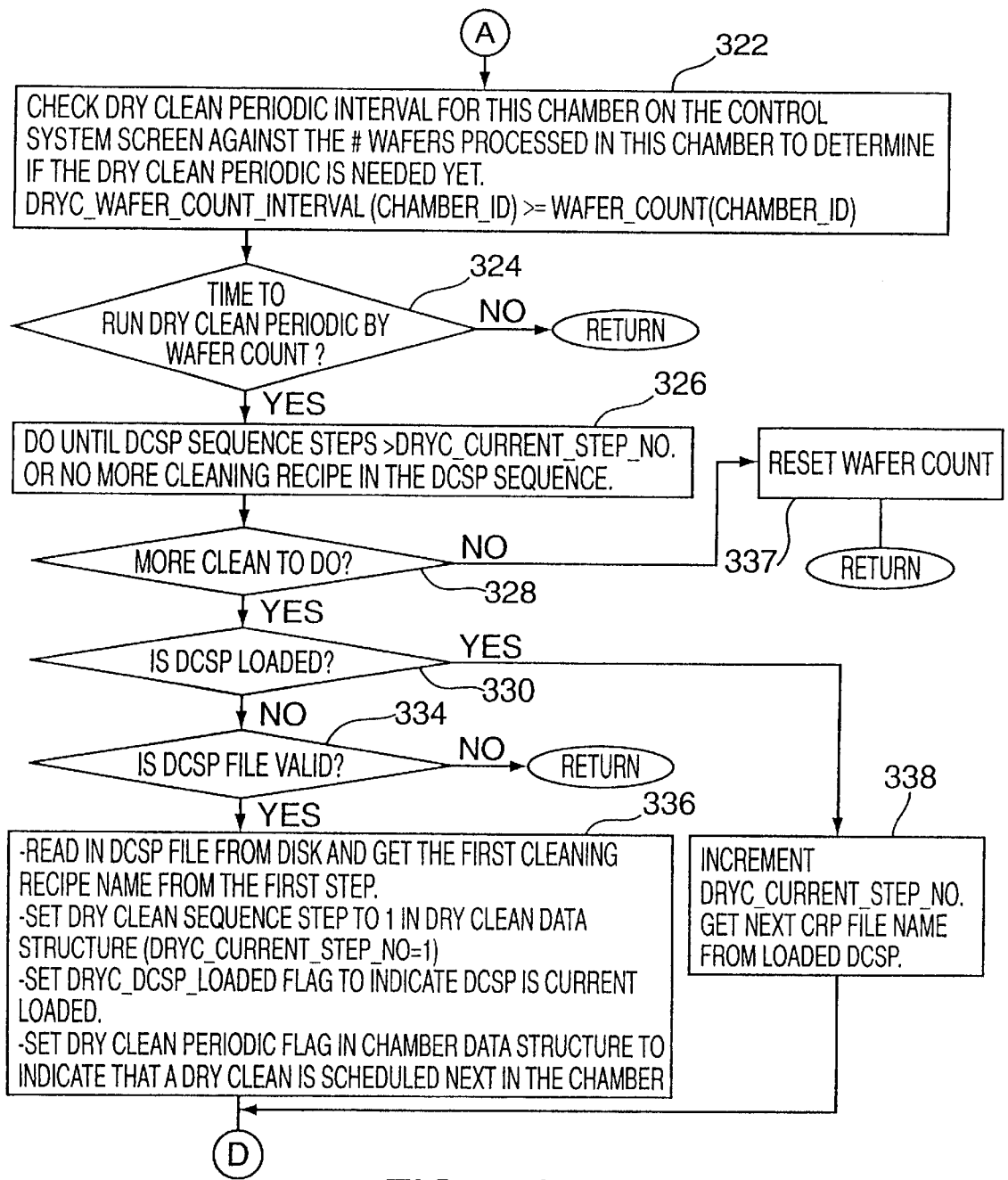

The main program of the cleaning process determines the check for the dry cleaning periodic interval based on the number of wafers processed by the routine in FIG. 14b which implements the block 314 of FIG. 14a. The routine, in block 322, compares the wafer count interval of the dry cleaning data structure for the particular chamber under consideration against the wafer count for that chamber in its chamber data structure. If the wafer count in the DCD structure is greater and/or equal to wafer count (actual count of processed wafers) in the chamber data structure, then it is not yet time to run the dry cleaning process and the program returns to the dry cleaning main program in the sequencer task module 200 to run the other cleaning checks. If, however, the actual wafer count processed for the chamber exceeds the count interval, then an affirmative answer is found in block 324 and the cleaning process is set up to be executed.

The program first determines whether there is more cleaning to be accomplished by determining whether the number of DCSP file sequence steps is greater than the current step number in block 326. If no more cleaning is required, as determined by a negative answer in block 328, then the wafer count is reset in block 337 and the program returns to the dry cleaning main program in the sequencer task module 200 to complete the real time check of all the other chambers.

If there are still more dry cleaning sequence program steps to be executed, then the answer is affirmative in block 328 and the next block 330 queries whether the DCSP file is loaded. If the DCSP file is loaded, then the current step number in the DCD cleaning structure 210 is incremented and the next cleaning recipe file name is obtained from the DCSP file and loaded in current memory. The CRP name is passed by the sequencer task module 200 to the chamber task module 204 for execution as will be hereinafter explained.

If the DCSP file has not been loaded yet, which is the case when it is the first time through this path, then the file name is checked in block 334 to determine if it is valid (i.e., by examining the prefix for the letters DSEQ). If the DCSP file is not valid for some reason, then the program returns to the dry cleaning main module. If, however, a valid DCSP file is found, in block 336 the file is read from the disk and the first cleaning recipe name is determined by reading it from the DCSP file. The cleaning sequence current step is set to one in the DCD structure, and the DCSP loaded flag is set to indicate that this cleaning sequence program is now scheduled for execution. The dry cleaning periodic flag in the chamber data structure is also set to indicate to the sequencer task module 200 that the chamber is busy. The program paths from blocks 336 and 338 then converge and transfer control to block 376 in FIG. 14e. The loop through block 338 is continued until all of the DSCP program steps (cleaning recipe files) have been executed and an exit taken through block 328.

Figure 14C:
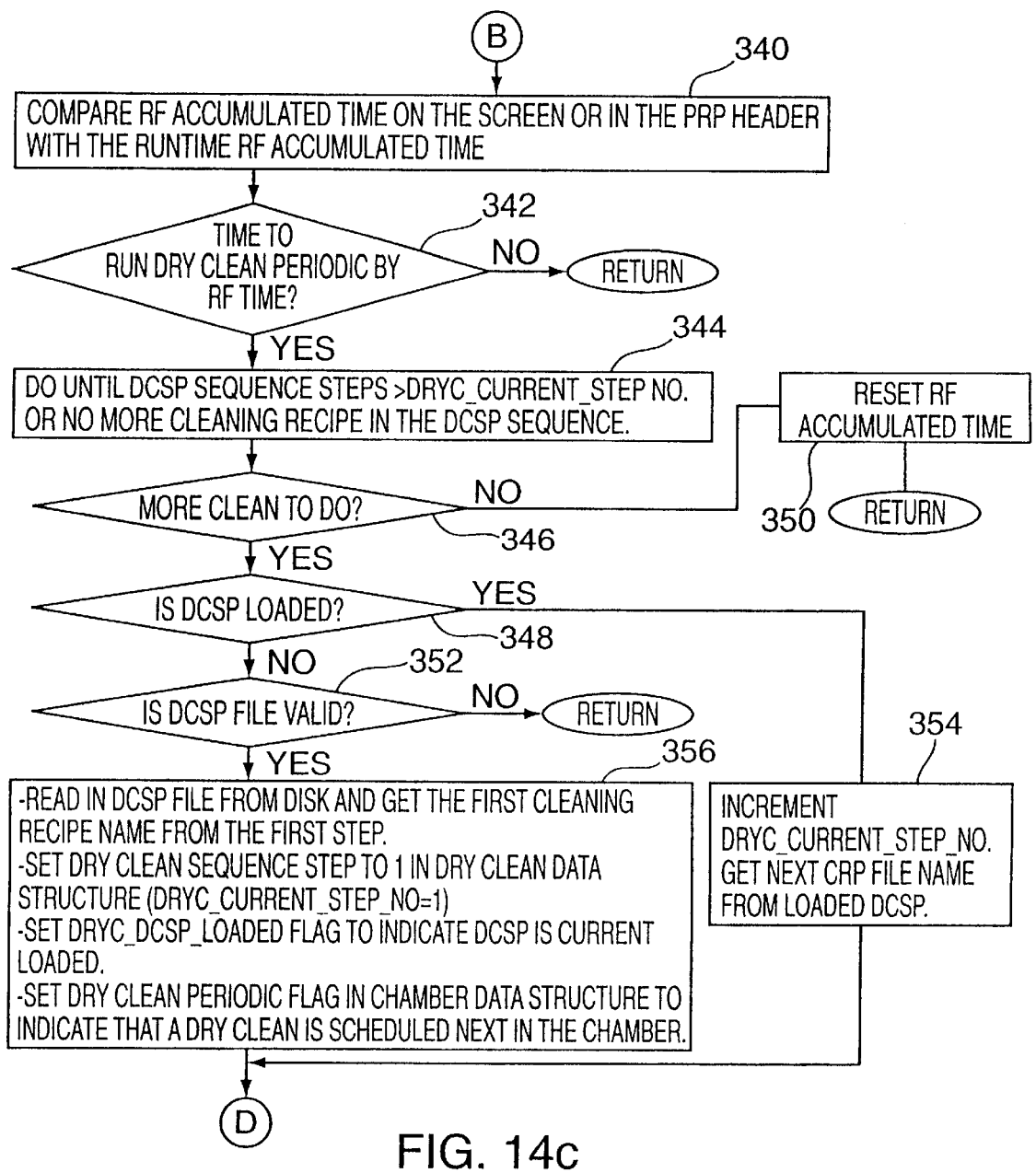

The main program of the cleaning process determines the check for the dry cleaning periodic interval based on RF accumulated on time by the routine in FIG. 14c which implements the block 316 of FIG. 14a. The routine in block 340 compares the accumulated RF on time interval of the dry cleaning data structure for the particular chamber under consideration against the actual RF on time for that chamber in its chamber data structure. If the interval in the DCD structure is greater and/or equal to actual RF on time in the chamber data structure, then it is not yet time to run the dry cleaning process and the program returns to the dry cleaning main program in the sequencer task module 200 to run the other cleaning checks. If, however, the actual RF on time for the chamber exceeds the accumulated RF on time interval, then an affirmative answer is found in block 342 and the cleaning process is set up to run.

The program first determines whether there is more cleaning to do by determining whether the number of DCSP file sequence steps is greater than the current step number in block 344. If there is no more cleaning to accomplish as determined by a negative answer in block 346, then the accumulated RF on time is reset in block 350 and the program returns to the dry cleaning main program in the sequencer task module 200 to complete the real time check of all the other chambers.

If there are still more dry cleaning sequence program steps to be executed, then the answer is affirmative in block 346 and the next block 348 queries whether the DCSP file program loaded. If the DCSP file is loaded, then the current step number in the DCD cleaning structure 210 is incremented and the next cleaning recipe file name is obtained from the DCSP file and loaded in the current memory in block 354. The CRP name is passed by the sequencer task module 200 to the chamber task module 204 for execution as will be hereinafter explained.

If the DCSP file has not been loaded yet, which is the case when it is the first time through this path, then the file name is checked in block 352 to determine if it is valid by examining the prefix for the letters DSEQ. If the DCSP file is not valid for some reason, then the program returns to the dry cleaning main module. If, however, a valid DCSP file is found, in block 356 the file is read from the disk and the first cleaning recipe name is determined by reading it from the DCSP file. The cleaning sequence current step is set to one in the DCD structure, and the DCSP loaded flag is set to indicate that this cleaning sequence program is now scheduled for execution. The dry cleaning periodic flag in the chamber data structure is also set to indicate to the sequencer task module 200 that the chamber is busy. The program paths from blocks 354 and 356 then converge and transfer control to block 376 in FIG. 14e. The loop through block 354 is continued until all of the DSCP program steps (cleaning recipe files) have been executed and an exit taken through block 346.

Figure 14D:
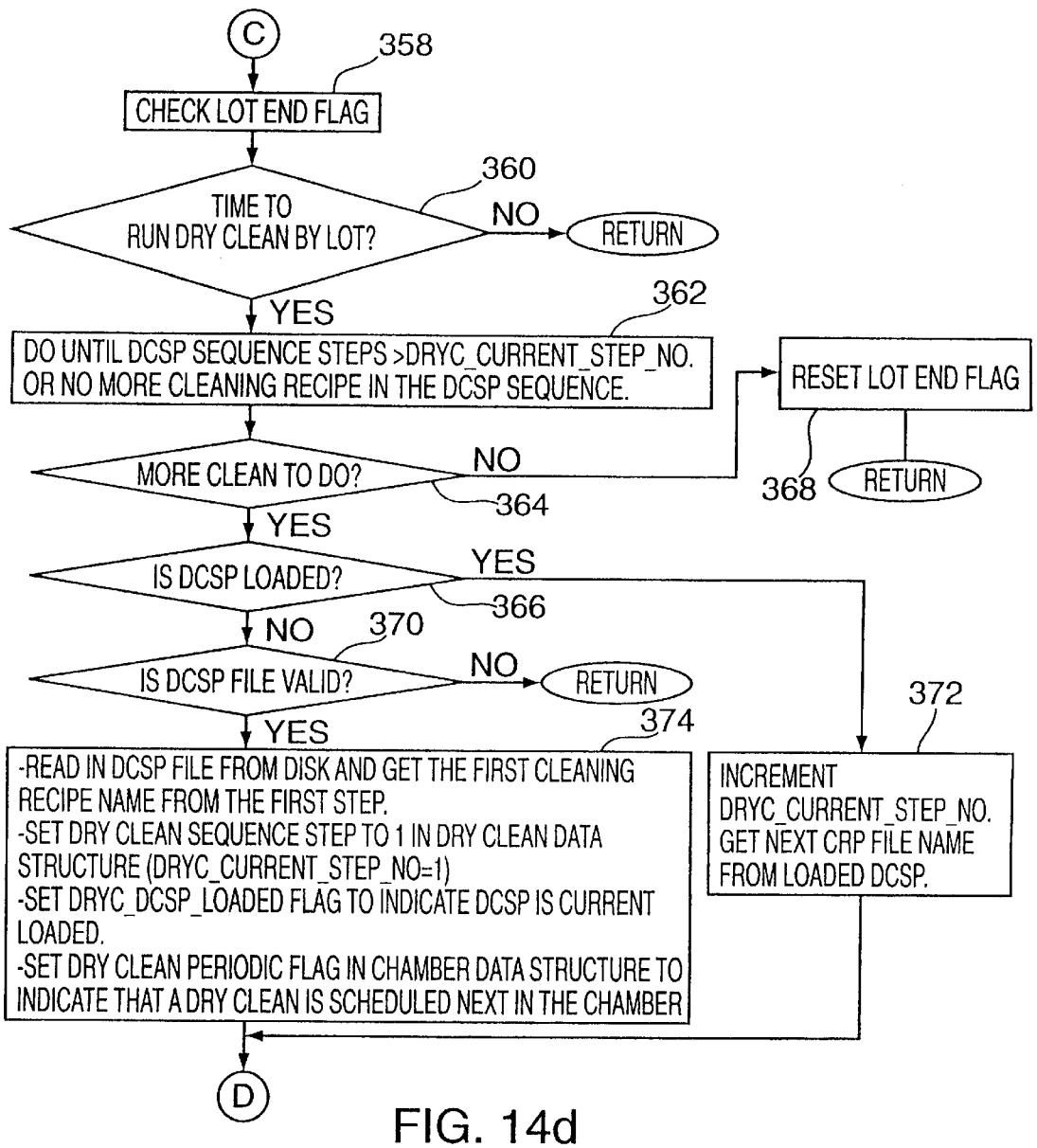

The main program of the cleaning process determines the check for the dry cleaning based on lot by the routine in FIG. 14d which implements the block 318 of FIG. 14a. The routine in block 358 determines if the flag in the chamber data structure indicating the end of a wafer lot is set. If the flag is not set, then it is not yet time to run the dry cleaning process and the program returns to the dry cleaning main program in the sequencer task module 200 to run the other cleaning checks. If, however, the flag is set, then an affirmative answer is found in block 360 and the cleaning process is set up to run.

The program first determines whether there is more cleaning to accomplish by determining whether the number of DCSP file sequence steps is greater than the current step number in block 362. If there is no more cleaning to accomplish as determined by a negative answer in block 364, then the lot flag is reset in block 368 and the program returns to the dry cleaning main program in the sequencer task module 200 to complete the real time check of all the other chambers.

If there are still more dry cleaning sequence program steps to be executed, then the answer is affirmative in block 364 and the next block 366 asks, is the DCSP file program loaded? If the DCSP file is loaded, then the current step number in the DCD cleaning structure 210 is incremented and the next cleaning recipe file name is obtained from the DCSP file and loaded in the current memory in block 372. The CRP name is passed by the sequencer task module 200 to the chamber task module 204 for execution as will be hereinafter explained.

If the DCSP file has not been loaded yet, which is the case when it is the first time through this path, then the file name is checked in block 370 to determine if it is valid by examining the prefix for the letters DSEQ. If the DCSP file is not valid for some reason, then the program returns to the dry cleaning main module. If, however, a valid DCSP file is found, in block 374 the file is read from the disk and the first cleaning recipe name is determined by reading it from the DCSP file. The cleaning sequence current step is set to one in the DCD structure, and the DCSP loaded flag is set to indicate that this cleaning sequence program is now scheduled for execution. The dry cleaning periodic flag in the chamber data structure is also set to indicate to the sequencer task module 200 that the chamber is busy. The program paths from blocks 372 and 374 then converge and transfer control to block 376 in FIG. 14e. The loop through block 372 is continued until all of the DSCP program steps (cleaning recipe files) have been executed and an exit taken through block 364.

Figure 14E:
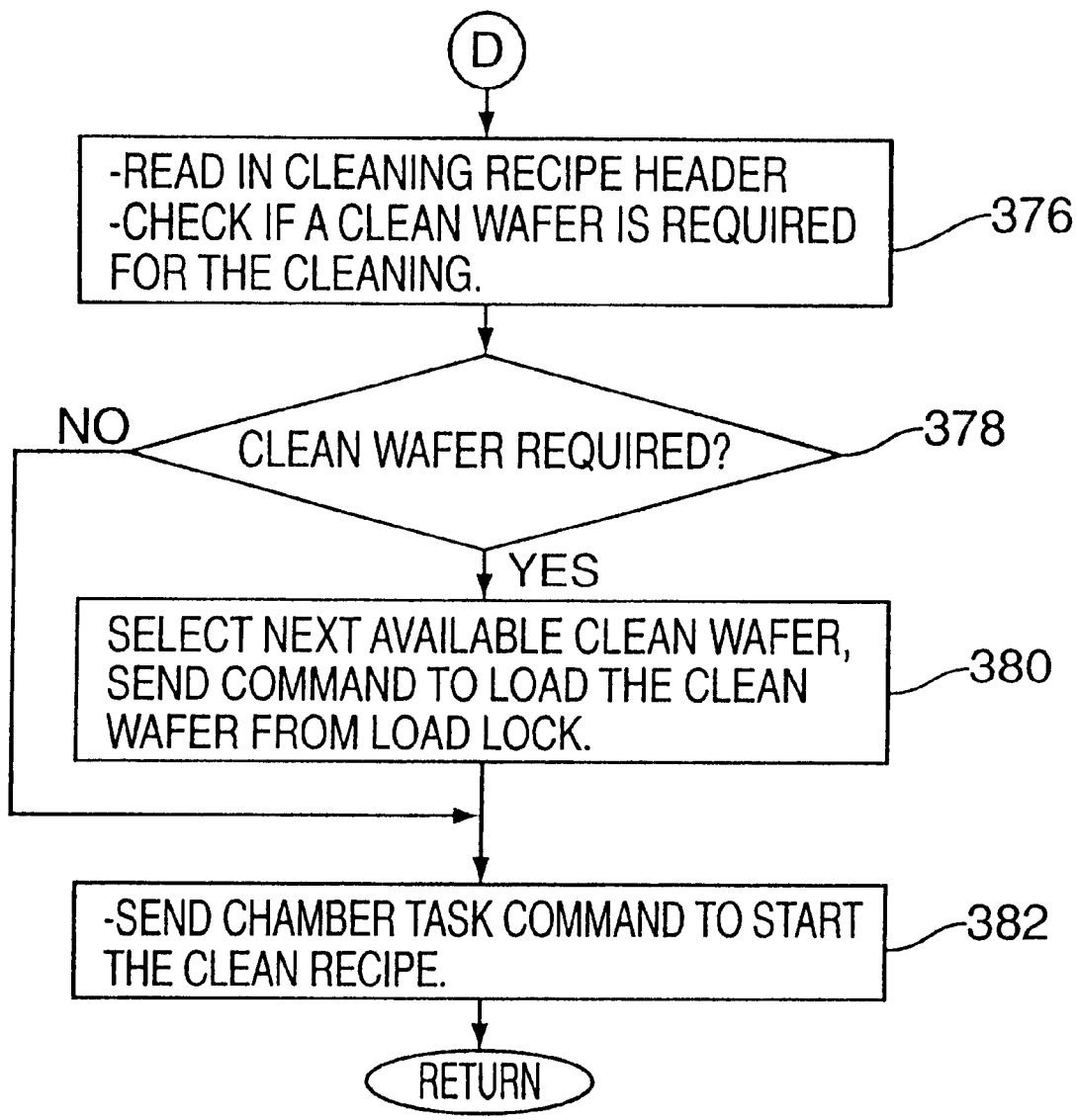

Continuing from the programs of FIGS. 14b, 14c and 14d, the cleaning recipe header of the CRP for the sequence step is then read and a check is made to determine if a cleaning wafer is required for the cleaning recipe in block 376 of FIG. 14e. If a cleaning wafer is not required, then the chamber task module 204 is sent a command to start the cleaning recipe in block 382. If a cleaning wafer is required, as tested for in block 378, a cleaning wafer is selected and a command to load a cleaning wafer from the load lock is sent to the buffer chamber task module 208 in block 380 to move the wafer from the load lock to the chamber about to be cleaned. After the wafer move command is issued, then the chamber task module 204 is commanded to start the cleaning recipe as before.

Figure 15:
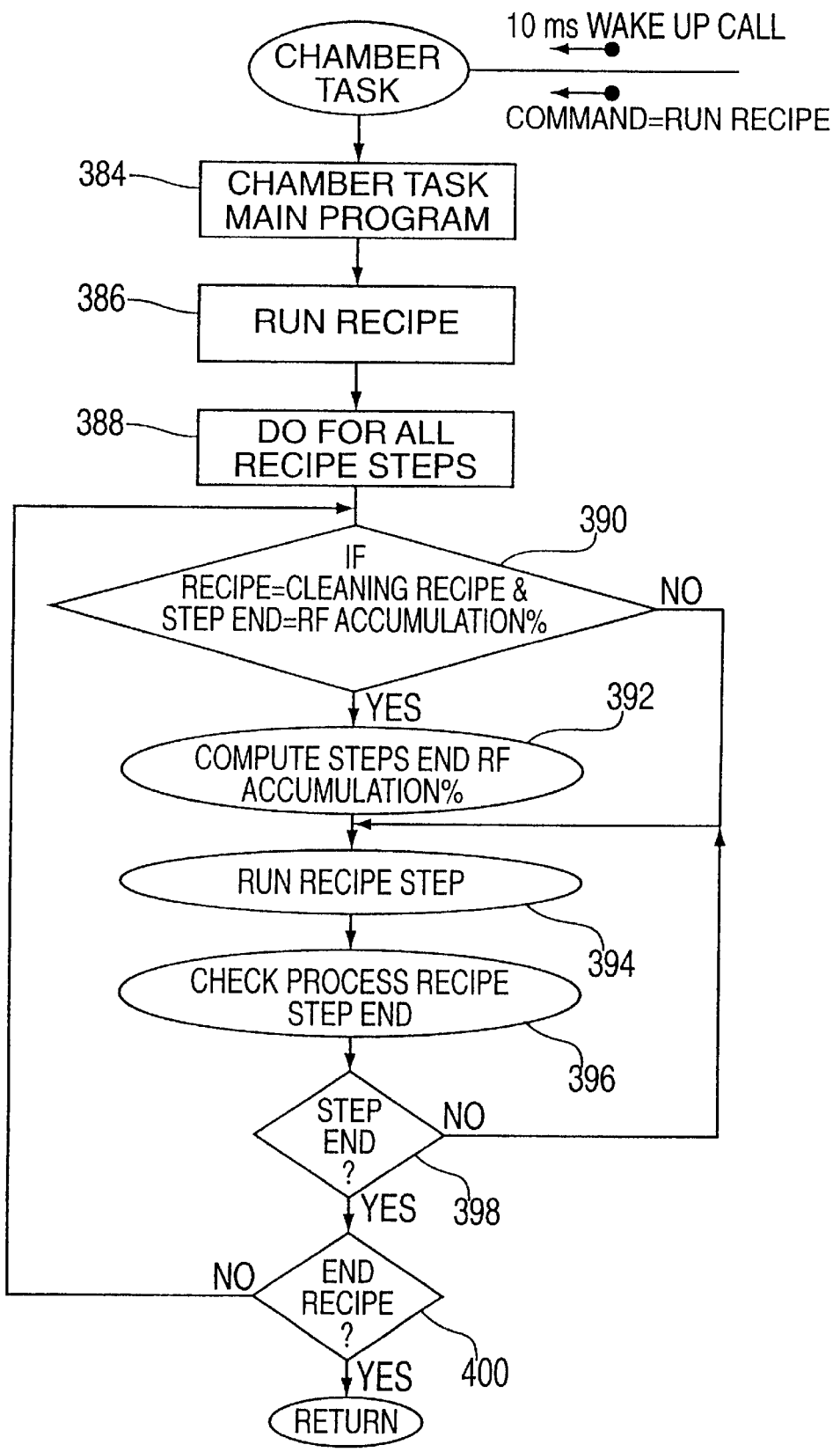
FIG. 15 is a detailed flow diagram of the automatic cleaning process operations of the chamber task module illustrated in FIG. 13.

The chamber task module 298 functions related to the cleaning process are more fully described in FIG. 15. The chamber task module 298 is another real time module which is called by an interrupt on a 10 ms periodic basis. The chamber module receives messages from the other modules which are identified in its main program 384. When it receives a command to run a cleaning recipe step, it will call the run cleaning recipe routine in the block 386 which will complete all the recipe steps 383 in the corresponding DCSP file for the process chamber under consideration. The first determination in block 390 is whether the recipe step is a cleaning recipe and whether the step end condition of that step is RF accumulated time as a percentage of total time (i.e., RF accumulation percentage). If not, then the program goes immediately to run the recipe step in block 394 to produce the required action or chemistry in the process chamber. After the recipe step is started, the step end time flag is checked in the chamber data structure to determine if it is set in block 396. If it is not, as tested for in block 398, then the program will branch back to block 394 to continue execution until the step is complete. Once a step is completed, the routine will test in block 400 if this is the end of the sequence. If not, a branch to block 390 will cause the next recipe step to be executed for the chamber. For those recipe steps which have a step end based upon an RF accumulation percentage, an alternate branch is through step 390 is to block 392 where a RF accumulation percentage is computed by reading in the RF accumulation percentage data from the dry cleaning data structure and comparing the RF accumulation percentage data to the end time data of the chamber data structure. When they are equal, the step end flag is set in the chamber data structure. After all the recipe steps have been run for the particular chamber as tested for in block 400, the program exits to the module or sub-module from which it was called.

While the invention has been described in connection with a preferred embodiment, this specification is not intended to limit the scope of the invention to the particular forms set forth, but, on the contrary, it is intended to cover any such alternatives, modifications, and equivalents as may be included within the spirit and scope of the invention as defined by the appended claims.

What is claimed is:

1. A substrate processing system for processing semiconductor substrates in steps, said system comprising:
    at least one processing chamber for performing at least one cleaning process; and
    a controller, coupled to processing chamber, having a sequencer task module for determining a cleaning interval for said processing chamber based on a chamber operating parameter and for executing said at least one cleaning process for said at least one processing chamber in accordance with said cleaning interval when said at least one processing chamber is not busy between the steps.

2. The system of claim 1, wherein said chamber operating parameter is a measure of a number or processed substrates.

3. A substrate processing system for processing semiconductor substrates, said system comprising:
    at least one processing chamber for performing at least one cleaning process; and
    a controller, coupled to processing chamber, having a sequencer task module for determining a cleaning interval for said processing chamber based on a chamber operating parameter and for executing said at least one cleaning process for said at least one processing chamber in accordance with said cleaning interval when said at least one processing chamber is not busy;
    wherein said chamber operating parameter is a measure of a substrate lot size.

4. A substrate processing system for processing semiconductor substrates, said system comprising:
    at least one processing chamber for performing at least one cleaning process; and
    a controller, coupled to processing chamber, having a sequencer task module for determining a cleaning interval for said processing chamber based on a chamber operating parameter and for executing said at least one cleaning process for said at least one processing chamber in accordance with said cleaning interval when said at least one processing chamber is not busy;
    wherein said chamber operating parameter is a measure of a RF accumulated on time.

5. A substrate processing system for processing semiconductor substrates, said system comprising:
    at least one processing chamber for performing at least one cleaning process; and
    a controller, coupled to processing chamber, having a sequencer task module for determining a cleaning interval for said processing chamber based on a chamber operating parameter and for executing said at least one cleaning process for said at least one processing chamber in accordance with said cleaning interval when said at least one processing chamber is not busy;
    wherein said chamber operating parameter is a measure of a type of chemistries processed in the chamber.

6. A substrate processing system for processing semiconductor substrates, said system comprising:
    at least one processing chamber for performing at least one cleaning process; and
    a controller, coupled to processing chamber, having a sequencer task module for determining a cleaning interval for said processing chamber based on a chamber operating parameter and for executing said at least one cleaning process for said at least one processing chamber in accordance with said cleaning interval when said at least one processing chamber is not busy;
    wherein said chamber operating parameter is a measure of an amount of elapsed time of chamber use since a last cleaning.

7. A substrate processing system for processing semiconductor substrates, said system comprising:
    at least one processing chamber for performing at least one cleaning process; and
    a controller, coupled to processing chamber, having a sequencer task module for determining a cleaning interval for said processing chamber based on a chamber operating parameter and for executing said at least one cleaning process for said at least one processing chamber in accordance with said cleaning interval when said at least one processing chamber is not busy;

wherein said controller employs a first data structure to store a number of cleaning parameters, where said first data structure includes a data field for linking said at least one cleaning process to a process recipe.

8. The system of claim 7, wherein said at least one cleaning process is stored in a second data structure, where said second data structure includes a sequence of cleaning recipe steps, where said cleaning recipe steps correspond to one or more process steps of said process recipe.

9. The system of claim 8, wherein each of said recipe cleaning steps is stored in a third data structure, wherein said third data structure includes a sequence of recipe steps.

10. A substrate processing system for processing semiconductor substrates, said system comprising:
   at least one processing chamber for performing at least one cleaning process; and
   a controller, coupled to processing chamber, having a sequencer task module for determining a cleaning interval for said processing chamber based on a chamber operating parameter and for executing said at least one cleaning process for said at least one processing chamber in accordance with said cleaning interval when said at least one processing chamber is not busy;
   wherein the software instructions further include a screen task module that enables an operator to interactively input data relating to the cleaning process.

11. A processing system for processing semiconductor substrates in steps, the system comprising:
   at least one processing chamber adapted to perform at least one cleaning process; and
   a system controller, coupled to the processing chamber, the system controller comprising:
   a processor and
   a memory, addressable by the processor, including software instructions adapted to enable the computer system to perform the steps of:
   determining a cleaning interval for the processing chamber based on a chamber operating parameter; and
   executing the cleaning process for the processing chamber in accordance with the cleaning interval when the processing chamber is not busy between the steps.

12. The processing system of claim 11, wherein the chamber operating parameter is a measure of a number or processed substrates.

13. The processing system of claim 11, wherein the software instructions are further adapted to enable the computer system to perform the step of determining periodically.

14. A processing system for processing semiconductor substrates, the system comprising:
   at least one processing chamber adapted to perform at least one cleaning process; and
   a system controller, coupled to the processing chamber, the system controller comprising:
   a processor and
   a memory, addressable by the processor, including software instructions adapted to enable the computer system to perform the steps of:
   determining a cleaning interval for the processing chamber based on a chamber operating parameter; and
   executing the cleaning process for the processing chamber in accordance with the cleaning interval when the processing chamber is not busy;
   wherein the chamber operating parameter is a measure of a substrate lot size.

15. A processing system for processing semiconductor substrates, the system comprising:
   at least one processing chamber adapted to perform at least one cleaning process; and
   a system controller, coupled to the processing chamber, the system controller comprising:
   a processor and
   a memory, addressable by the processor, including software instructions adapted to enable the computer system to perform the steps of:
   determining a cleaning interval for the processing chamber based on a chamber operating parameter; and
   executing the cleaning process for the processing chamber in accordance with the cleaning interval when the processing chamber is not busy;
   wherein the chamber operating parameter is a measure of accumulated RF power on time.

16. A processing system for processing semiconductor substrates, the system comprising:
   at least one processing chamber adapted to perform at least one cleaning process; and
   a system controller, coupled to the processing chamber, the system controller comprising:
   a processor and
   a memory, addressable by the processor, including software instructions adapted to enable the computer system to perform the steps of:
   determining a cleaning interval for the processing chamber based on a chamber operating parameter; and
   executing the cleaning process for the processing chamber in accordance with the cleaning interval when the processing chamber is not busy;
   wherein the chamber operating parameter is a measure of a type of chemistry processed in the chamber.

17. A processing system for processing semiconductor substrates, the system comprising:
   at least one processing chamber adapted to perform at least one cleaning process; and
   a system controller, coupled to the processing chamber, the system controller comprising:
   a processor and
   a memory, addressable by the processor, including software instructions adapted to enable the computer system to perform the steps of:
   determining a cleaning interval for the processing chamber based on a chamber operating parameter; and
   executing the cleaning process for the processing chamber in accordance with the cleaning interval when the processing chamber is not busy;
   wherein the chamber operating parameter is a measure of an amount of elapsed time of chamber use since a last cleaning.

18. A processing system for processing semiconductor substrates, the system comprising:
   at least one processing chamber adapted to perform at least one cleaning process; and
   a system controller, coupled to the processing chamber, the system controller comprising:
   a processor and
   a memory, addressable by the processor, including software instructions adapted to enable the computer system to perform the steps of:

determining a cleaning interval for the processing chamber based on a chamber operating parameter; and executing the cleaning process for the processing chamber in accordance with the cleaning interval when the processing chamber is not busy;

wherein the software instructions further include a screen task module that enables an operator to interactively input data relating to the cleaning process.

19. A processing system for processing semiconductor substrates, the system comprising:

at least one processing chamber adapted to perform at least one cleaning process; and a system controller, coupled to the processing chamber, the system controller comprising:

a processor and a memory, addressable by the processor, including software instructions adapted to enable the computer system to perform the steps of:

determining a cleaning interval for the processing chamber based on a chamber operating parameter; and executing the cleaning process for the processing chamber in accordance with the cleaning interval when the processing chamber is not busy;

wherein the software instructions further include a chamber task module that runs one or more cleaning recipe steps for the chamber.

20. A processing system for processing semiconductor substrates, the system comprising:

at least one processing chamber adapted to perform at least one cleaning process; and a system controller, coupled to the processing chamber, the system controller comprising:

a processor and a memory, addressable by the processor, including software instructions adapted to enable the computer system to perform the steps of:

determining a cleaning interval for the processing chamber based on a chamber operating parameter; and executing the cleaning process for the processing chamber in accordance with the cleaning interval when the processing chamber is not busy;

wherein the software instructions further include a slow task module that monitors slow tasks for the system.

* * * * *